(12) United States Patent
Chang et al.

(10) Patent No.: US 8,258,827 B2
(45) Date of Patent: Sep. 4, 2012

(54) FREQUENCY DOUBLER

(75) Inventors: Chih-Hsiang Chang, Taichung (TW); Jung-Mao Lin, Taichung (TW); Ching-Yuan Yang, Taichung (TW)

(73) Assignee: Industrial Technology Research Institute, Chutung (TW)

( * ) Notice: Subject to any disclaimer, the term of this patent is extended or adjusted under 35 U.S.C. 154(b) by 13 days.

(21) Appl. No.: 12/789,424

(22) Filed: May 27, 2010

(65) Prior Publication Data

US 2011/0175651 A1 Jul. 21, 2011

(30) Foreign Application Priority Data

Jan. 19, 2010 (TW) .............................. 99101318 A

(51) Int. Cl.
*H03B 19/00* (2006.01)
(52) U.S. Cl. ......... 327/122; 327/116; 327/119; 327/356
(58) Field of Classification Search .................. 327/115, 327/116, 117, 118, 355–361, 202, 203, 208–212, 327/218; 377/47, 48
See application file for complete search history.

(56) References Cited

U.S. PATENT DOCUMENTS

| | | | | |
|---|---|---|---|---|
| 5,495,194 | A * | 2/1996 | Sugawara | 327/113 |
| 6,211,708 | B1 | 4/2001 | Klemmer | |
| 6,380,777 | B1 * | 4/2002 | Degardin et al. | 327/170 |
| 6,664,824 | B2 | 12/2003 | Laws | |
| 6,781,445 | B2 * | 8/2004 | Feldman | 327/563 |
| 6,826,393 | B1 * | 11/2004 | Komurasaki et al. | 455/326 |
| 7,432,763 | B2 * | 10/2008 | Leete | 330/254 |
| 7,508,898 | B2 * | 3/2009 | Cyr et al. | 375/376 |
| 2003/0067359 | A1 * | 4/2003 | Darabi et al. | 331/46 |
| 2006/0038550 | A1 * | 2/2006 | Nazarian | 323/315 |
| 2008/0150583 | A1 * | 6/2008 | Lu et al. | 326/83 |
| 2008/0266002 | A1 * | 10/2008 | Liu et al. | 331/25 |

FOREIGN PATENT DOCUMENTS

WO 2009154521 A1 12/2009

OTHER PUBLICATIONS

Copani et al., A BiCMOS Voltage Controlled Oscillator and Frequency Doubler for K-Band Applications, 2008 IEEE Radio Frequency Integrated Circuits Symposium, 2008, pp. 537-540.
Notice of Allowance of corresponding CN application issued on Jun. 5, 2012.

* cited by examiner

*Primary Examiner* — Lincoln Donovan
*Assistant Examiner* — Brandon S Cole
(74) *Attorney, Agent, or Firm* — Wang Law Firm, Inc.; Li K. Wang

(57) ABSTRACT

A frequency doubler receiving an in-phase oscillating signal and an inverse oscillating signal and generating an output signal oscillating at a multiplied frequency, accordingly. The frequency doubler has a first transistor, a second transistor, a first inductor and a second inductor. A first terminal of the first transistor and a first terminal of the second transistor are at a common voltage. The frequency doubler receives the in-phase oscillating signal and the inverse oscillating signal via control terminals of the first and second transistors. The first and second inductors couple a second terminal of the first transistor and a second terminal of the second transistor to an output terminal of the frequency doubler, respectively. The first and second inductors may be separate inductance devices or, in another case, be implemented by a symmetric inductor.

5 Claims, 5 Drawing Sheets

FREQUENCY DOUBLER

CROSS REFERENCE TO RELATED APPLICATIONS

This Application claims priority of Taiwan Patent Application No. 099101318, filed on Jan. 19, 2010, the entirety of which is incorporated by reference herein.

TECHNICAL FIELD

The present invention relates to a frequency doubler.

BACKGROUND

Growth in wireless communications has been driven by wideband communications of more than 10 Giga Hertz (GHz). FIG. 1 depicts the frequency spread of several wireless communication techniques. As shown, Terrestrial Trunked Radio (TETRA) is labeled 102; Global System for Mobile Communications 900 (GSM 900) is labeled 104; GSM 1800 is labeled 106; $3^{rd}$ generation Mobile System (3G) is, labeled 108; Wireless Local Area Network 802.11b/g (WLAN 802.11b/g) is labeled 110; WLAN 802.11a is labeled 112; Ultrawideband (UWB) is labeled 114; and Wireless High Definition (wireless HD) is labeled 116. As shown, available communications frequencies reach 60 GHz.

For high frequency communications, advanced manufacturing processes is required for manufacturing transmitters and receivers. Thus, production cost is increased. Meanwhile, maintaining the bandwidth of a communications system is an important issue. However, it is very difficult and costly to both provide high frequency communications and wideband communications.

SUMMARY

The invention discloses a frequency doubler, receiving an in-phase oscillating signal and an inverse oscillating signal from an oscillator, and multiplying an oscillating frequency of the in-phase and inverse oscillating signals to generate an output signal at an output terminal of the frequency doubler.

An exemplary embodiment of the frequency doubler comprises a first transistor, a second transistor, a first inductor and a second inductor. Each of the first and second transistors has a first terminal, a second terminal and a control terminal. The first terminals of the first and second transistors have a common voltage. The control terminals of the first and second transistors are coupled to the in-phase oscillating signal and the inverse oscillating signal respectively. The first inductor couples the second terminal of the first transistor to the output terminal of the frequency doubler. The second inductor couples the second terminal of the second transistor to the output terminal of the frequency doubler.

The first and second inductors may be implemented in various forms. In an exemplary embodiment, the first and second inductors may be separate inductance components. In some embodiments, there may be mutual inductance between the separate inductance components. In other embodiments, the first and second inductors are provided by a symmetric inductor. The symmetric inductor has a first connecting terminal and a second terminal at a first side, and has a third terminal at a second side. The first and second terminals of the symmetric inductor are coupled to the second terminals of the first and second transistors, respectively, while the third terminal of the symmetric inductor is coupled to the output terminal of the frequency doubler.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION

The following description shows several exemplary embodiments carrying out the invention. This description is made for the purpose of illustrating the general principles of the invention and should not be taken in a limiting sense. The scope of the invention is best determined by reference to the appended claims.

Figure 1:
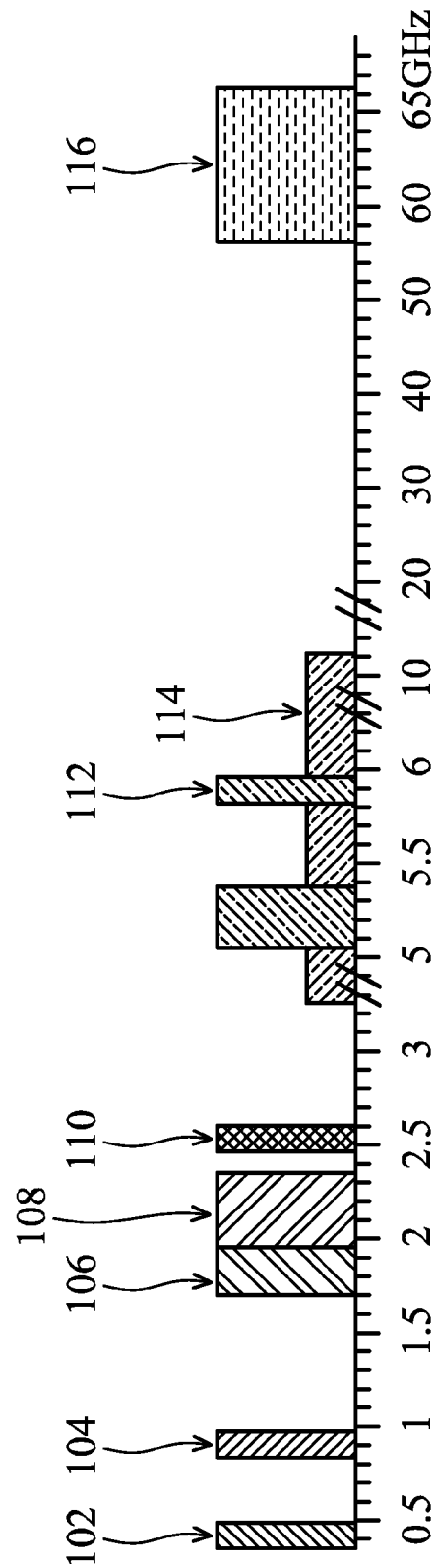
FIG. 1 depicts the frequency spread of several wireless communication techniques.
Figure 2:
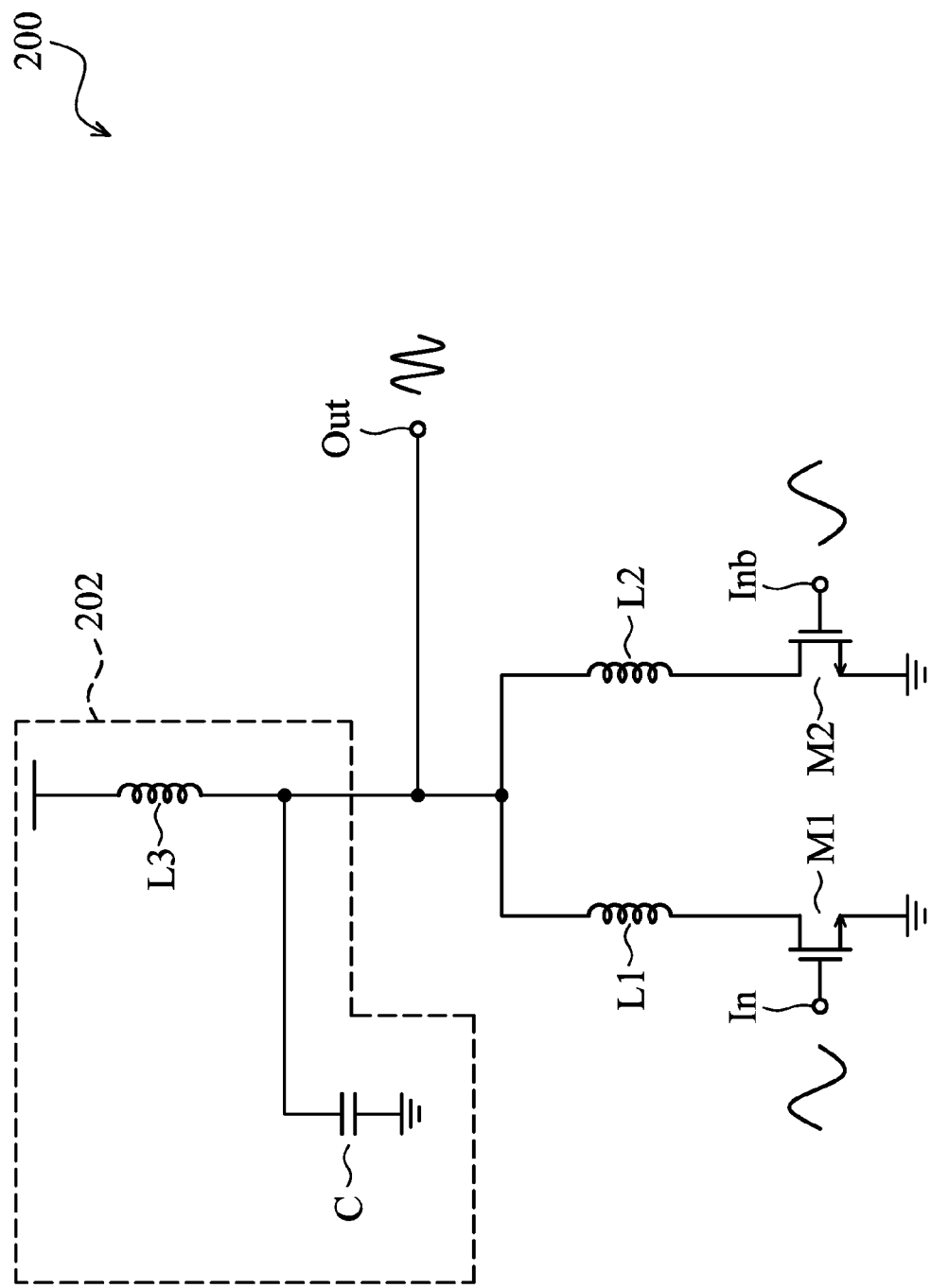
FIG. 2 depicts an exemplary embodiment of the frequency doubler.

FIG. 2 depicts an exemplary embodiment of the frequency doubler. The frequency doubler 200 has two input terminals and one output terminal. The input terminals are coupled to an oscillator (not shown) to receive an in-phase oscillating signal In and an inverse oscillating signal Inb from the oscillator, respectively. The phase difference between the in-phase oscillating signal In and the inverse oscillating signal Inb are 180 degrees. According to the in-phase oscillating signal In and the inverse oscillating signal Inb, the frequency doubler 200 generates an output signal Out at the output terminal thereof. In comparison with the in-phase oscillating signal In and the inverse oscillating signal Inb, the output signal Out oscillates at a higher frequency.

In the exemplary embodiment shown in FIG. 2, a basic frequency multiplying structure is introduced in the frequency doubler 200. The basic frequency multiplying structure comprises a first transistor M1, a second transistor M2, a first inductor L1 and a second inductor L2. Each of the first and second transistors M1 and M2 has a first terminal, a second terminal and a control terminal. The first and second transistors M1 and M2 may be two N-channel Metal Oxide Semiconductor (NMOS) transistors with identical size. The first, second and control terminals of each of the first and second transistors M1 and M2 are a source, a drain and a gate of an NMOS transistor, respectively. In FIG. 2, the first terminals (sources) of the first and second transistors M1 and M2 are at a common voltage (such as ground). The control terminals (gates) of the first and second transistors M1 and M2 receive the in-phase oscillating signal In and the inverse oscillating signal Inb from an oscillator (not shown), respectively. The second terminal (drain) of the first transistor M1 is coupled to the output terminal Out of the frequency doubler 200 via the first inductor L1, and the second terminal (drain) of the second transistor M2 is coupled to the output terminal Out of the frequency doubler 200 via the second inductor L2.

In addition to the first, second transistors M1 and M2 and the first and second inductors L1 and L2, the frequency doubler 200 comprises an optional component—a filter 202. The filter 202 comprises a third inductor L3 and a capacitor C, operative to filter noise of the in-phase oscillating signal In and the inverse oscillating signal Inb. The third inductor L3 is coupled between a power source terminal and the output terminal Out of the frequency doubler 200. The capacitor C couples the output terminal Out of the frequency doubler 200 to ground.

Figure 3C:
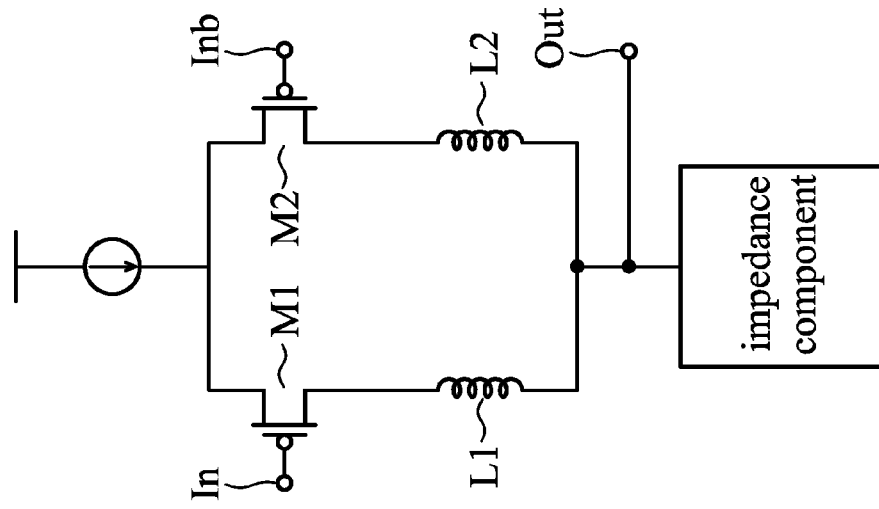
FIGS. 3a . . . 3c show several variants of the frequency doubler.
Figure 3B:
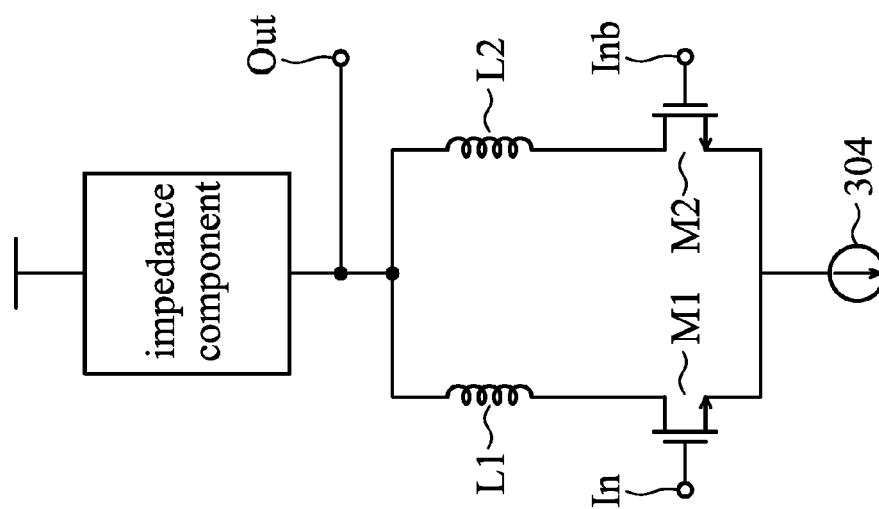
Figure 3A:
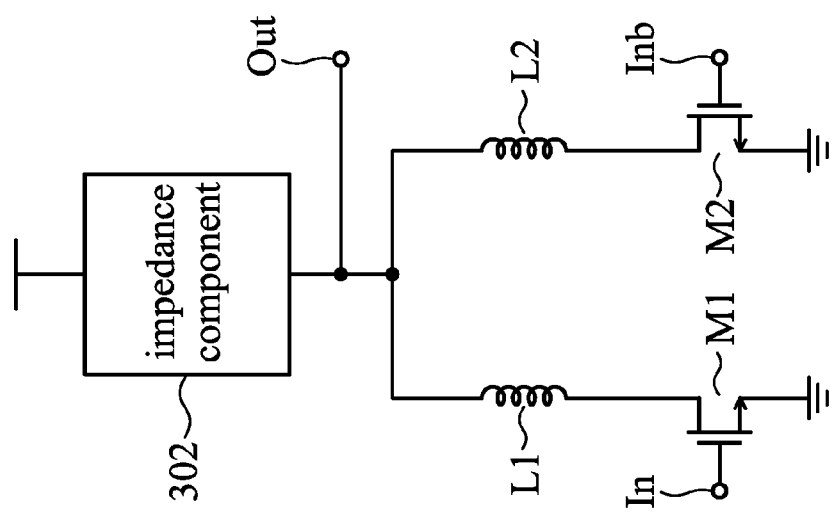

The circuit shown in FIG. 2 is not intended to limit the scope of the invention. The components of FIG. 2 may be replaced by other similar electrical elements known by those skilled in the art. For example, the first and second transistors M1 and M2 may be Bipolar Junction Transistors (BJTs) rather than MOSs. In a case wherein the first and second transistors M1 and M2 are BJTs, the first, second and control terminals of each of the first and second transistor M1 or M2 are emitter, collector and base terminals of a BJT, respectively. In some embodiments, an impedance component is coupled between the power source terminal and the output terminal of the frequency doubler 200 instead of coupling the filter 202 therebetween. FIGS. 3a . . . 3c show several variants of the frequency doubler. As shown, the variants are constructed based on a basic frequency multiplying structure, wherein the basic frequency multiplying structure consists of the first and second transistors M1 and M2 and the first and second inductors L1 and L2.

As shown in FIG. 3a, the filter 202 of FIG. 2 is replaced by an impedance component 302 (may be any impedance device known by those skilled in the art). In FIG. 3b, the first terminals (sources, at a common voltage) of the first and second transistors M1 and M2 are coupled to a current source 304. In FIG. 3c, the first and second transistors M1 and M2 are PMOS transistors rather than NMOS transistors. Note that the circuits shown in FIGS. 3a . . . 3c are not intended to limit the scope of the invention. Any circuit comprising the basic frequency multiplying structure (including the first and second transistors M1 and M2 and the first and second inductors L1 and L2) and capable of multiplying the oscillating frequency of the inputs is considered as an embodiment.

Figure 4:
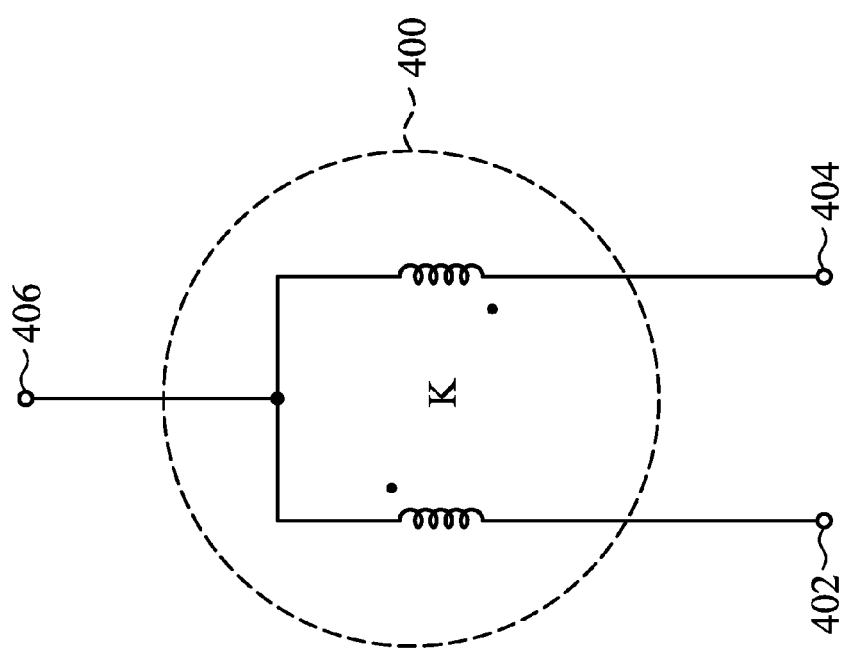
FIG. 4 depicts an exemplary embodiment of a symmetric inductor.

Furthermore, the first and second inductors L1 and L2 may be implemented in various forms. For example, the first and second inductors L1 and L2 may be separate inductance devices, and the second terminals (drains) of the first and second transistor M1 and M2 are coupled to the output terminal Out of the frequency doubler 200 by the separate inductance devices. In some embodiments, there may be mutual inductance between the first and second inductors L1 and L2. In some embodiments, a symmetric inductor is used rather than separate inductance devices. FIG. 4 depicts an exemplary embodiment of a symmetric inductor. As shown, there are two inductors within the symmetric inductor 400, to play the role of the said first and second inductors L1 and L2. Note that the two inductors shown in FIG. 4 provide a mutual inductance therebetween. A first connecting terminal 402 and a second connecting terminal 404 are provided at a first side of the symmetric inductor 400, and a third connecting terminal 406 is provided at a second side of the symmetric inductor 400. The first and second connecting terminals 402 and 404 at the first side of the symmetric inductor 400 are coupled to the second terminals (drains) of the first and second transistors M1 and M2, respectively. The third connecting terminal 406 at the second side of the symmetric inductor 400 is coupled to the output terminal Out of the frequency doubler 200.

Figure 5:
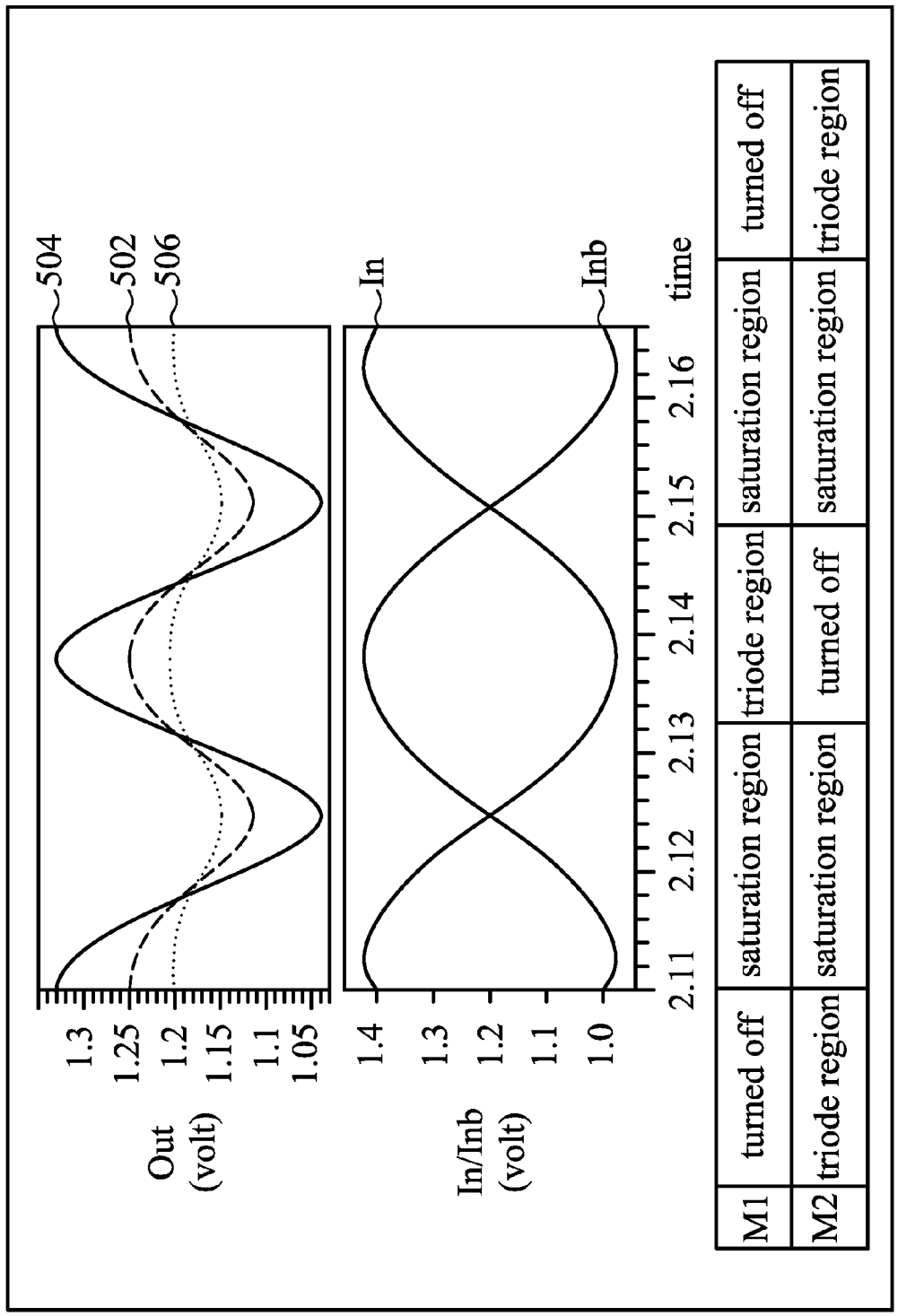
FIG. 5 shows waveforms depicting the relationship between the output and the inputs of the frequency doubler, and further provides a table showing the states of the first and second transistors M1 and M2.

According to the structure of FIG. 2, FIG. 5 shows waveforms depicting the relationship between the output (output signal Out of FIG. 2) and the inputs (in-phase oscillating signal In and inverse oscillating signal Inb) of the frequency doubler of the invention. FIG. 5 also provides a table showing the states of the first and second transistors M1 and M2. When the first and second inductors L1 and L2 are implemented by separate inductance devices and there is no mutual inductance therebetween, the output signal Out may be that shown as in waveform 502. When the first and second inductors L1 and L2 are provided by the symmetric inductor 400 of FIG. 4, the output signal Out may be that as shown in waveform 504. Waveform 506 shows how the output signal Out oscillates when the first and second inductors L1 and L2 are removed from the circuit of FIG. 2. In comparison with the waveform 506, the amplitude of the waveforms 502 and 504 is greater than that of the waveform 506. The first and second inductors L1 and L2 provide considerable improvement in signal amplification.

Referring to the table of FIG. 5, it shows how the in-phase oscillating signal In and the inverse oscillating signal Inb control the first and second transistors M1 and M2. The first and second transistors M1 and M2 may be switched between a triode region and a saturation region or may be turned off. The current of the first and second transistors M1 and M2 oscillates according to the states of the first and second transistors M1 and M2. The first and second inductors L1 and L2 operate as an amplifier, and they transform the current oscillation of the first and second transistors M1 and M2 to a voltage form and add the transformed voltage oscillations to the second terminals of the first and second transistors M1 and M2, respectively. Through the connection between the first and second inductors L1 and L2, signal mixing is accomplished for the multiplying of the oscillating frequency. As shown in FIG. 5, the output signal Out oscillates at a higher frequency than that of the in-phase oscillating signal In and the inverse oscillating signal Inb. Comparing the waveforms 502, 504 and 506, the signal amplification of the conventional frequency doubler without the first and second inductors L1 and L2 of the invention is weak. The smallest oscillating amplitude is shown as the waveform 506. The first and second inductors L1 and L2 of the invention improve signal amplification of a frequency doubler. The corresponding waveforms 502 and 504 show the signal amplification. Comparing the waveforms 502 and 504, it shows that a better signal amplification is provided by a frequency doubler with a mutual inductance effect (corresponding to the waveform 504).

Furthermore, the first and second inductors L1 and L2 may further expand the bandwidth of a frequency doubler when coexisting with the filter 202. In the embodiment of FIG. 2, the first and second inductors L1 and L2 may be considered for signal filtering. The first and second inductors L1 and L2 reduce the total equivalent inductance at the output terminal of the frequency doubler 200, so that the bandwidth of the circuit is improved.

Note that signal amplifying and signal filtering techniques disclosed in the invention may not require any transistors. Thus, the frequency doubler of the invention can work normally using a lower operation voltage in comparison with conventional techniques.

Thus, power consumption is dramatically reduced in the frequency doubler of the invention. Most of the current flowing through the signal amplifying circuit (including the first and second inductors L1 and L2) also flows through the signal mixer (including the first and second transistors M1 and M2). The sharing of the current reduces power consumption considerably.

In conclusion, the frequency doubler of the invention multiplies the oscillating frequency of the received signals, provides wide bandwidth and low power consumption, and is capable of low voltage operation. A desirable frequency doubler is disclosed to be applied to high frequency communication systems. Because no expensive manufacturing process is required to manufacture the frequency doubler of the invention, low cost transmitters or receivers may be made available.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A frequency doubler, comprising:
   a first transistor, having a first terminal, a second terminal and a control terminal, wherein the control terminal of the first transistor receives an in-phase oscillating signal;
   a second transistor, having a first terminal, a second terminal and a control terminal, wherein the control terminal of the second transistor receives an inverse oscillating signal, and the first terminal of the second transistor is the same voltage as the first terminal of the first transistor;
   a symmetric inductor, wherein, at a first side of the symmetric inductor there is a first connecting terminal and a second connecting terminal coupled to the second terminals of the first and second transistors, respectively, and, at a second side of the symmetric inductor there is a third connecting terminal coupled to an output terminal of the frequency doubler; and
   a filter coupled to the output terminal of the frequency doubler, wherein the filter comprises:
      an inductor, coupling a power source to the output terminal of the frequency doubler, wherein the power source powers the frequency doubler; and
      a capacitor, coupled between the output terminal of the frequency doubler and ground.

2. The frequency doubler as claimed in claim 1, wherein the first and second transistors are Metal Oxide Semiconductor transistors, and the first, second and control terminals of each of the first and second transistors are a source, a drain and a gate of one Metal Oxide Semiconductor transistor, respectively.

3. The frequency doubler as claimed in claim 1, wherein the first and second transistors are Bipolar Junction Transistors, and the first, second and control terminals of each of the first and second transistors are an emitter, a collector and a base of one Bipolar Junction Transistor, respectively.

4. The frequency doubler as claimed in claim 1, wherein the first terminals of the first and second transistors are connected together.

5. The frequency doubler as claimed in claim 4, wherein the first terminals of the first and second transistors are further connected to a current source.

* * * * *